US006329812B1

(12) United States Patent
Sundin

(10) Patent No.: US 6,329,812 B1
(45) Date of Patent: Dec. 11, 2001

(54) POSITION MEASURING DEVICE FOR DETECTING DISPLACEMENTS WITH AT LEAST THREE DEGREES OF FREEDOM

(75) Inventor: Martin Sundin, Zurich (CH)

(73) Assignee: Sundin GmbH, Zurich (CH)

( * ) Notice: Subject to any disclaimer, the term of this patent is extended or adjusted under 35 U.S.C. 154(b) by 0 days.

(21) Appl. No.: 09/319,123

(22) PCT Filed: Dec. 2, 1997

(86) PCT No.: PCT/IB97/01498

§ 371 Date: Jul. 6, 1999

§ 102(e) Date: Jul. 6, 1999

(87) PCT Pub. No.: WO98/25193

PCT Pub. Date: Jun. 11, 1998

(30) Foreign Application Priority Data

Dec. 4, 1996 (CH) .................................................. 2983/96

(51) Int. Cl.[7] ............................ G05G 9/047; G01B 7/00; G01R 27/26

(52) U.S. Cl. ............................... 324/207.16; 324/207.22; 324/207.23; 324/207.25; 324/662; 324/699; 73/862.043; 74/471 XY; 200/6 A

(58) Field of Search ......................... 324/207.15, 207.16, 324/207.2–207.26, 262, 661, 662, 699, 654, 655; 73/862.41–862.44, 862.05, 862.06; 74/471 XY; 200/6 A

(56) References Cited

U.S. PATENT DOCUMENTS

| | | | | |
|---|---|---|---|---|
| 4,091,234 | * | 5/1978 | Bristow . | |
| 4,631,478 | * | 12/1986 | Knetsch et al. | 324/207.13 |
| 4,641,123 | | 2/1987 | Whitehead . | |
| 4,785,180 | | 11/1988 | Dietrich et al. . | |
| 4,811,608 | | 3/1989 | Hilton . | |
| 5,002,241 | | 3/1991 | Tizac . | |
| 5,160,918 | * | 11/1992 | Saposnik et al. | 324/207.2 X |
| 5,168,221 | * | 12/1992 | Houston | 324/207.22 X |
| 5,349,881 | * | 9/1994 | Olorenshaw et al. | 74/471 XY |
| 5,377,950 | | 1/1995 | Salcudean et al. . | |
| 5,438,261 | * | 8/1995 | Codina et al. | 324/207.16 |
| 5,497,804 | * | 3/1996 | Codina et al. | 324/207.15 X |
| 5,559,432 | * | 9/1996 | Logue | 324/207.22 X |
| 5,576,704 | * | 11/1996 | Baker et al. | 74/471 X |

FOREIGN PATENT DOCUMENTS

| | | | | |
|---|---|---|---|---|
| 3303738 | * | 8/1984 | (DE) | 324/207.16 |
| 0 235 779 | | 9/1987 | (EP) . | |
| 0 240 023 | | 10/1987 | (EP) . | |
| 0 244 497 | | 11/1987 | (EP) . | |
| 0 383 663 | | 8/1990 | (EP) . | |

* cited by examiner

*Primary Examiner*—Gerard R. Strecker
(74) *Attorney, Agent, or Firm*—Merchant & Gould P.C.

(57) ABSTRACT

The invention comprises a fixed platform (1) and a displaceable platform (2) that are coupled by six tension springs (3) and an elastic spacing element (6), which forms with each platform, for instance, a ball-and-socket joint, so that the platforms can be displaced in a total of five to six degrees of freedom with respect to each other. Displacement is detected by measuring at the tension springs (3) or at the spacing element (6). This is preferably done by measuring the inductivity of the tension springs (3), thereby making it possible to easily determine the relative position of the platforms.

15 Claims, 10 Drawing Sheets

POSITION MEASURING DEVICE FOR DETECTING DISPLACEMENTS WITH AT LEAST THREE DEGREES OF FREEDOM

CROSS REFERENCE TO RELATED APPLICATIONS

This application claims the priority of Swiss patent application 2983/96, filed Dec. 12, 1996, the disclosure of which is incorporated herein by reference in its entirety.

1. Technical Field

The invention relates to a position-measuring device.

Devices of this type are especially used as input or operating apparatus, e.g. for operating screen graphics (e.g. for CAD systems) and computer animations, for controlling robots, for moving parts of tool and measurement machines (spindle boxes and measuring heads), as sensors or for controlling remote controlled probes and surgical instruments.

2. State of the Art

In conventional devices, where displacements with three or even five to six degrees of freedom are measured, complicated measuring electronics are required, which makes the devices more expensive and unwieldy, or simpler measuring electronics are used, which, however, lead to unsatisfactory ergonomic properties. Examples of such devices are given in U.S. Pat. No. 4,811,608, EP 244 497, EP 240 023 and EP 235 779. In all these devices, optical, mechanical or electrical sensors are required, which must additionally be housed in the device and lead to a correspondingly complicated setup.

SUMMARY OF THE INVENTION

Hence, it is an object of the invention to provide a device of the type mentioned above that avoids these disadvantages.

Hence, parameters of the elastic coupler are measured directly, such as forces, electrical properties, etc. In this way, separate sensors can be dispensed with or be designed in very compact manner, since the coupling device itself forms at least a part of the sensors.

In a preferred embodiment several inductivities of the coupler, or of parts of the coupler are measured. Thus, for instance, the inductivity of springs of the coupler depending on the dilatation is measured.

Further electric parameters that can be measured are the electric resistance or the capacity of parts of the coupler.

Since three or more parameters must be measured for detecting the position or orientation with three or more degrees of freedom, these parameters are preferably measured sequentially, such that the individual measurements cause no mutual interferences and the apparatus remains simple.

The coupling device preferably comprises several spring members, in particular springs, which movably hold the two reference members at a distance from each other with the desired number of degrees of freedom. In a simple and therefore preferred embodiment, several extension springs and a spacer member are e.g. provided. The spacer member is connected in articulated manner to one or both reference members, e.g. via ball-and-socket joints. Depending on the number of the desired degrees of freedom, the spacer member can be compressible along its length.

The device is preferably designed such that the possible mutual displacement of the reference members upon an actuation by hand is perceived to be comparatively large, i.e. that it is as least 1 centimeter or 20° in each degree of freedom. Such displacements are distinctly perceived by a human user and allow a secure operation of the device.

The device according to the invention is especially suited as an input device for computers, a control device or a measuring device.

BRIEF DESCRIPTION OF THE DRAWINGS

Further advantages and applications of the invention result from the now following description making reference to the annexed drawings, wherein.

METHODS FOR CARRYING OUT THE INVENTION

Figure 1:
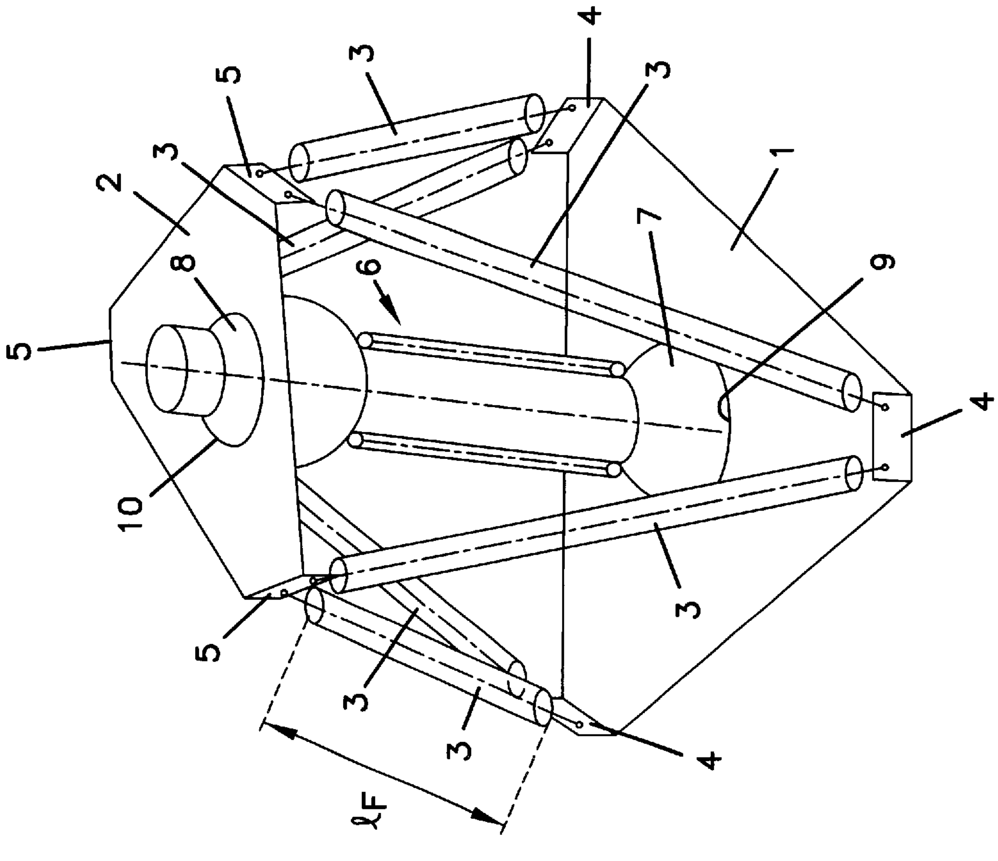
FIG. 1 is a first embodiment of the invention.

A first embodiment of the device according to the invention is shown in FIG. 1. Here, only those parts are shown that are of significance for the suspension and the actual measurement. Provided with a handle the device can e.g. be used as computer mouse with up to six degrees of freedom, i.e. as a hand sized apparatus, the displacements of which are generated by one hand and are measured and transferred to a target system. Further applications are listed at the end of the description.

The device comprises two platforms 1, 2, which act as the reference members, the mutual position of which is determined. Platform 1 is in the following called the fixed platform, platform 2 the movable platform. However, platform 2 could also be fixed and platform 1 movable, or both platforms can be arranged in movable manner.

Six schematically shown extension springs 3 are arranged between the two platforms, preferably coil springs made of steel or copper alloys. The extension springs 3 are not parallel to each other, nor are they parallel to a single plane. The extend from three lower points 4 of fixed platform 1 to three upper points 5 of movable platform 2. They lower and upper points are preferably approximately on the corners of a equilateral triangle, wherein the triangle of the lower points 4 is rotated about 60° in respect to the one of the upper points 5. Two extension springs 3 extend from each lower point 4, one to each of the neighboring upper points 4. It is also possible to arrange the extension springs in another manner between the platforms, wherein they are, in this embodiment, preferably not parallel and chosen such that the relative position of the two platforms can be calculated from their lengths.

Figure 2:
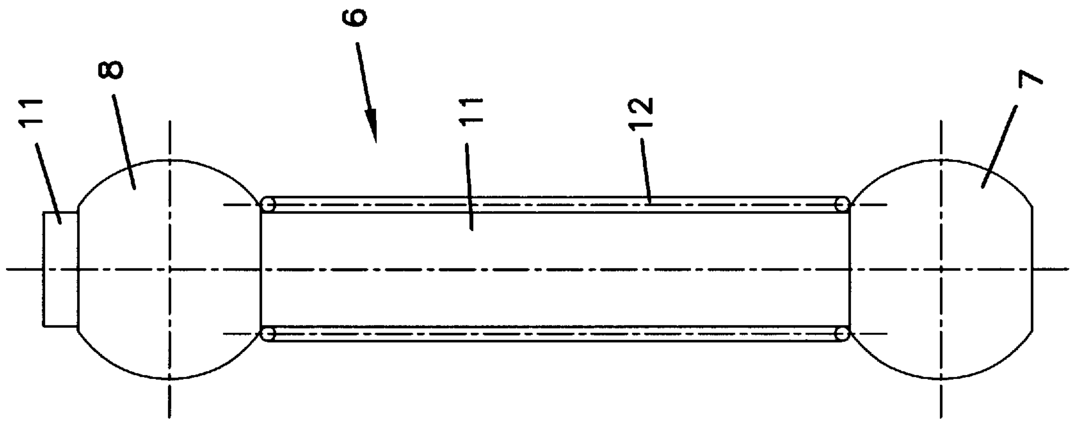
FIG. 2 is a detailed view of the spacer member of the embodiment of FIG. 1.

A spacer member 6, as shown in FIG. 2, is located between platforms 1, 2 and in the center of the extension springs 3. It comprises a lower ball 7 and an upper ball 8, which lie in corresponding holes 9 and 10 of the platforms 1, 2 and form two ball-and-socket joints with the same. Lower ball 7 is rigidly connected to a rod 11, to which upper ball 8 is mounted in axially displaceable manner. A (schematically shown) pressure spring 12 designed as a coil spring extends between balls 7 and 8. In mounted state as shown in FIG. 1, pressure spring 12 is biased and urges upper ball 8 and therefore upper platform 2 upwards. Hence, pressure spring 12 acts against the force of the extension springs 3.

In the embodiment of FIG. 1, upper platform 2 can be moved in respect to lower platform 1 in all three translational and all three rotative degrees of freedom because the spring elastic coupler consisting of spacer member 6 and the extension springs 3 allow displacements in all rotative and translational directions.

In an application as input device for computers, the lower, fixed platform 1 can rest on a table, while the user actuates a handle arranged on the upper, movable platform 2. The displacements (i.e. the rotations as well as the translations) of the movable platform 2 can be detected by differing methods as explained in the following.

In a preferred embodiment of the invention, the displacement or motion of the upper platform is calculated by measuring the inductivity of the tension springs 3. For this purpose, the relation is used that the inductivity $L_F$ of a coil shaped spring is approximately proportional to $z \cdot W/g$, wherein z is the number of windings, W the winding surface and g the distance between windings. The inductivity $L_F$ is therefore approximately proportional to the reciprocal length $\mathbf{1}_F$ (cf. FIG. 1) of the spring body. Therefore, by measuring the inductivity of all tension springs 3, their lengths $\mathbf{1}_F$ can be determined. From these six lengths $\mathbf{1}_F$ and from the stored configuration information of the device (i.e. the sizes of the two triangles formed by the lower points 4 and the upper points 5 or the relative positions of the spring suspension points on the corresponding platforms) the relative position of the two platforms 1, 2 can then be calculated.

Figure 3:
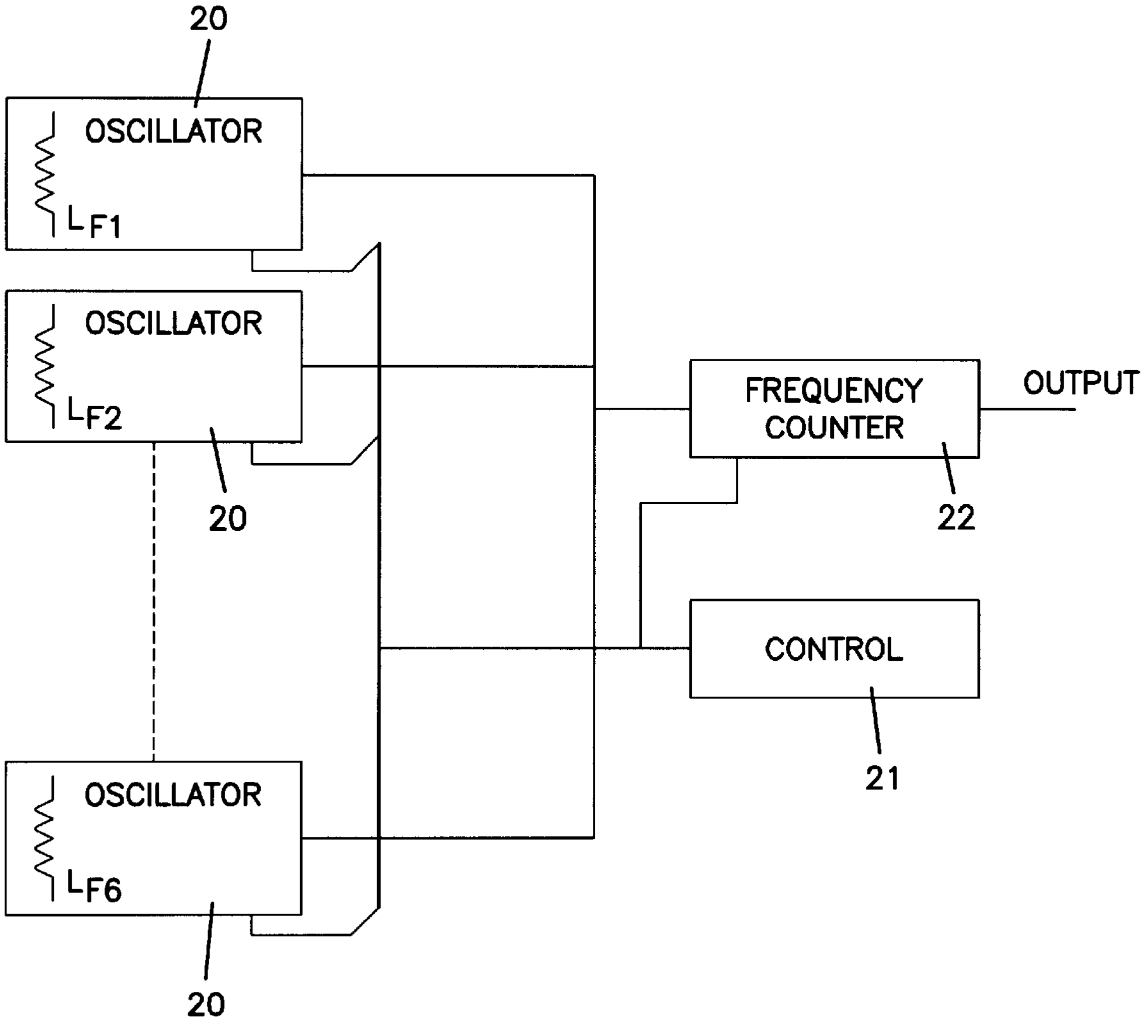
FIG. 3 is a block diagram of a circuit for measuring the spring inductivity.

FIG. 3 shows a circuit for determining the inductivity of the tension springs 3. Here, each tension spring 3 forms the inductivity $L_F$ of a LC-oscillator 20. For this purpose, the ends of the springs are connected with feed wires, which are not shown in FIG. 1.

The frequency of each LC-oscillator 20 is given in known manner by the inductivity $L_F$ and its parallel capacity. From the frequency and the given value of the capacity, the value of the inductivity $L_F$ can therefore be calculated.

Each oscillator 20 possesses a control input, by means of which it can be switched on and off. In switched off state, the oscillator is not oscillating and its output is on high impedance. When the oscillator is switched on, it is oscillating and generates an output signal. The outputs of the oscillators 20 are connected to each other and are led to a frequency counter 22.

In operation, control 21 operates the oscillators 20 in sequential phases of measurement one after the other. In each phase, only one oscillator 20 is in operation and its frequency is measured by frequency counter 22 and then fed to a computer (not shown). In this way, the inductivities L of all tension springs 3 can be determined one after the other in six measuring phases. This sequential operation avoids that the measurements of the individual springs interfere with each other. Furthermore, only a single frequency counter 22 is required.

In the present embodiment, springs with a diameter of 5 mm, a number of windings and, depending on extension, a distance between windings between approximately 0.5 and 1.0 mm are used, i.e. the inductivity $L_F$ is in the order of some $\mu$H. The oscillators are dimensioned such that their frequencies are in the range of several megahertz. In this way, an accurate measurement or frequency count can e.g. be carried out within a millisecond.

Figure 4:
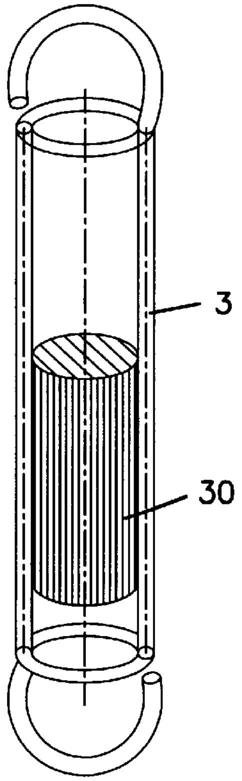
FIG. 4 is a spring with metal core.
Figure 5:
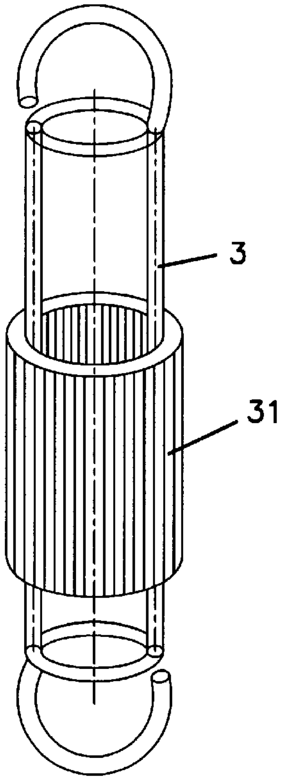
FIG. 5 is a spring with metal shell.

In order to make the effect of the change of inductivity of the springs stronger, each tension spring 3 can be provided with a core 30 or shell 31 of high magnetic permeability, as it is shown in FIGS. 4 and 5. The core 30 or shell 31 can e.g. be attached at one end to a coil of the spring, such that it maintains its vertical position.

Instead of the inductivity, other electric parameter of the coupler 3, 6 can be measured as well. Since the specific electric resistance of spring steel increases upon deformation, the lengths $\mathbf{1}_F$ of the tension springs 3 (and/or the pressure spring 12) can e.g. also be determined from their electric resistance $R_F$. Also this measurement is again carried out sequentially such that the complexity of the circuit is reduced.

Finally, electric capacities of the coupler 3, 6 could be measured as well. In this case, an arrangement according to FIGS. 4 or 5 could be used, too, wherein the core 30 or the shell 31 are insulated against spring 3 and are used as one electrode of a capacitor. The second electrode of the capacitor is then formed by the spring. The capacity $C_F$ of the capacitor formed in this way depends on how many of the windings are located in the area of core 30 or shell 31, respectively. The capacity measurement is again preferably carried out in sequential manner.

Figure 6:
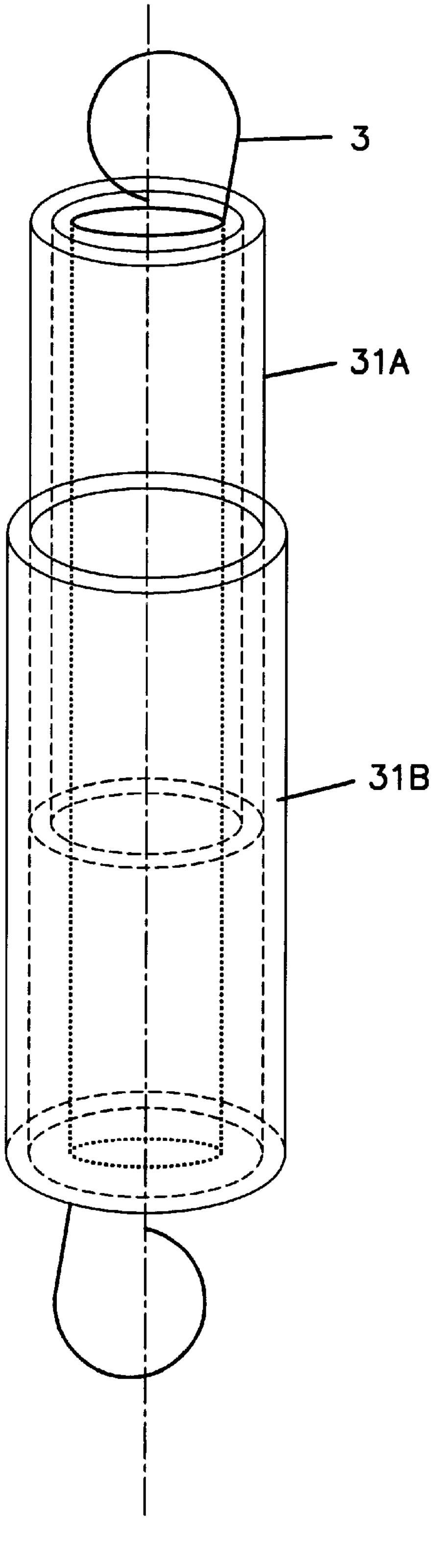
FIG. 6 is a spring with a capacitive measuring arrangement.

A further arrangement for a capacitive measurement is shown in FIG. 6. Here, the spring 3 is surrounded by two shells 31*a*, 31*b*, which are inserted telescopically into each other and electrically insulated from each other. One shell 31*a* is attached to the upper and the other shell 31*b* to the lower end of the spring. The capacity of the capacitor formed by the two shells 31*a*, *b* depends in linear manner from the length of the spring. The telescopic arrangement of FIG. 6 does not necessarily have to be arranged around a spring.

In the embodiment of FIG. 6, the spring 3 can also be dispensed with. In this case, the shells 31*a*, 31*b* are connected to the platforms 1, 2 and are in frictional contact with each other. A device with a coupler of this kind is not self-restoring, i.e. when platform 2 is moved and then released, it will remain in its moved position.

Figure 7:
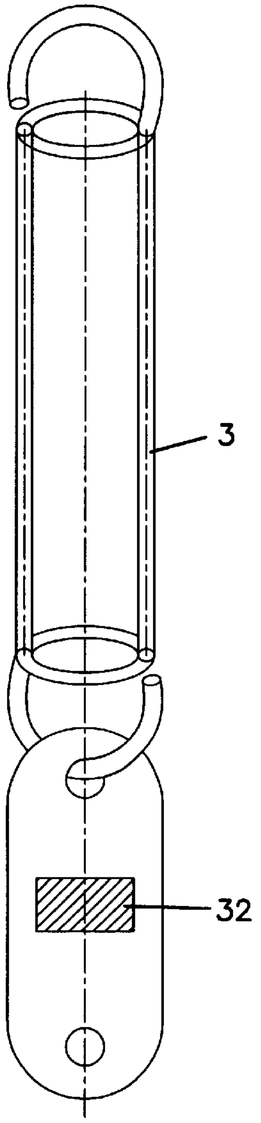
FIG. 7 is a spring with force sensor.

Non-electric properties of the coupler 3, 6 can be measured as well in order to determine its state of deformation. In particular, forces in the coupler can e.g. be measured for this purpose. The extension springs 3 can e.g. be provided with a force sensor 32, such as it is shown in FIG. 7. This sensor generates a signal that is proportional to the pulling force $F_F$ of spring 3, from which the length of the spring can be determined as well. A further example for such a device with force measurement is described further below.

A mechanical Eigenfrequency or resonance frequency $f_F$ of one or more of the springs 3 can be determined as well. Since the Eigenfrequencies of the springs depend on their state of extension, the length of the spring can also be determined by means of such a measurement.

The above methods of measurement can, of course, also be combined. Furthermore, measurements can also be carried out in the area of the spacer member 6 and, in particular, on its spring 12.

In the following, some further, preferred embodiments of the device according to the invention are discussed.

Figure 8:
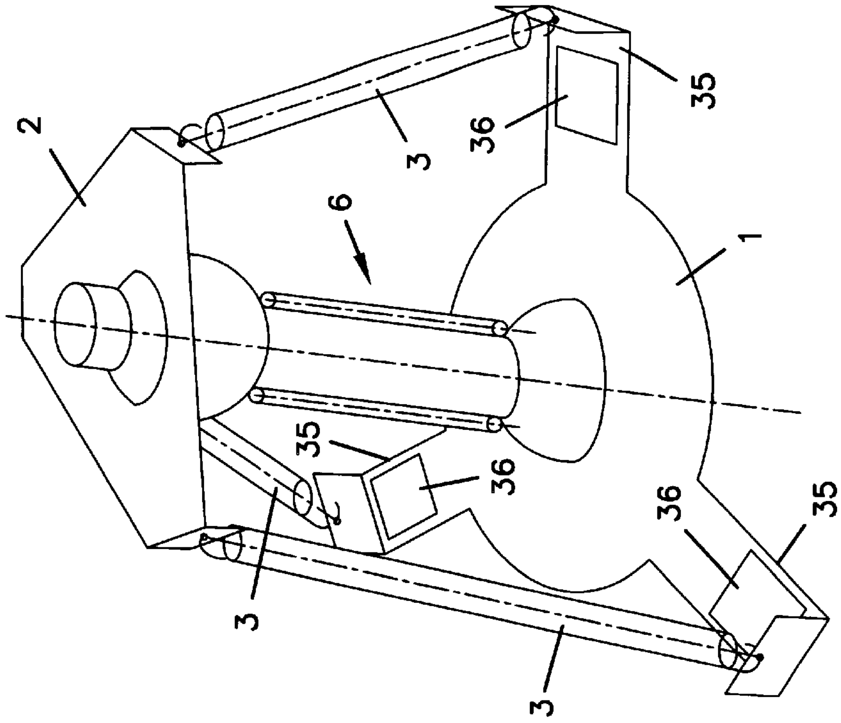
FIG. 8 is a second embodiment of the invention.

FIG. 8 shows an embodiment of the device with only three tension springs 3 and a spacer member 6. The spacer member 6 is again located in the center of forces of the tension springs 3 and acts against their pulling force.

The tension springs 3 are attached at their lower ends on three tongues 35. Flexion and torsion sensors 36 are arranged on the tongues. The tongues 35 are of a spring steel that is comparatively hard compared to the springs and are only slightly deformed by the pulling forces of the springs. The sensors 36 are designed such that they can not only determine the absolute value but also the direction of the individual force $F_F$. From this quantity, the length and direction of the corresponding tension spring and therefrom the position of the movable platform 2 can be calculated. Preferably, three values are measured, from which the exact direction and magnitude of the pulling force $F_F$ can be calculated completely. It is, however, also possible to carry out e.g. two measurements only, such that only two components or degrees of freedom of the pulling force are determined for each spring.

Figure 9:
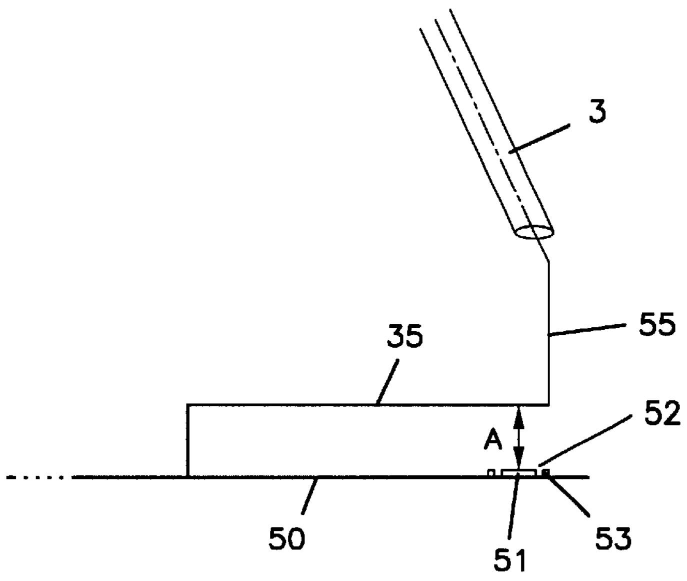
FIG. 9 is a side view onto a capacitive measuring arrangement for the embodiment of FIG. 8.
Figure 10:
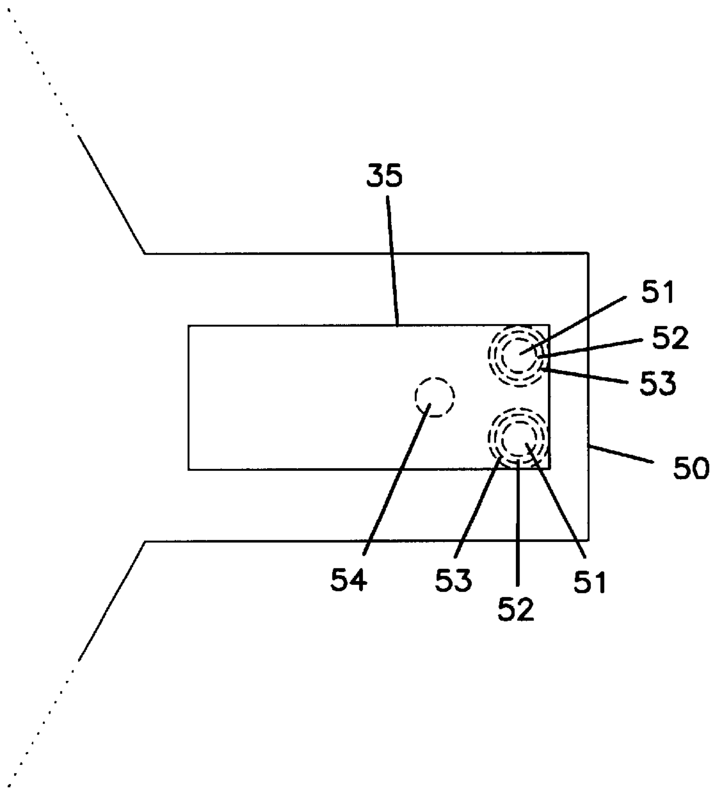
FIG. 10 is a top view onto the device of FIG. 9.

FIGS. 9 and 10 show an alternative, capacitive measurement of the state of the springs of the embodiment of FIG. 8. Here, the tongues are arranged close above a printed circuit 50. Two or three measurement electrodes 51 are arranged on printed circuit 50 below each tongue 35, the capacity of which in respect to the corresponding tongue 35 is determined. For achieving a measurement that is as linear as possible, an insulating ring 52 and an annular auxiliary electrode 53 are arranged around each measuring electrode 51, wherein the potential of the auxiliary electrode tracks the one of the measuring electrode such that the field of the measuring electrode becomes as homogeneous as possible. By measuring the capacity of two measuring electrodes 51 in respect to each tongue 35, the torsion and flexion of the same can be determined. By using a third measuring electrode in position 54, the derivative of the flexion and thereby the end point of the spring can also be determined. It is also possible to measure the torsion only on the fixed platform 1 and to measure the flexion on the movable platform 2. This is done preferably without part 55, which generates a torque, i.e. the spring 3 is attached directly to tongue 35, such that the individual components of spring 3 can be measured immediately.

Therefore, in the device of FIG. 8, several complementary values are measured, such that the total number of springs can also be smaller than six, while still all the translational and rotative coordinates of the movable platform can be determined.

In the embodiments of the invention described so far, movable platform 2 has a total of six degrees of freedom. This number can, however, also be reduced.

Figure 11:
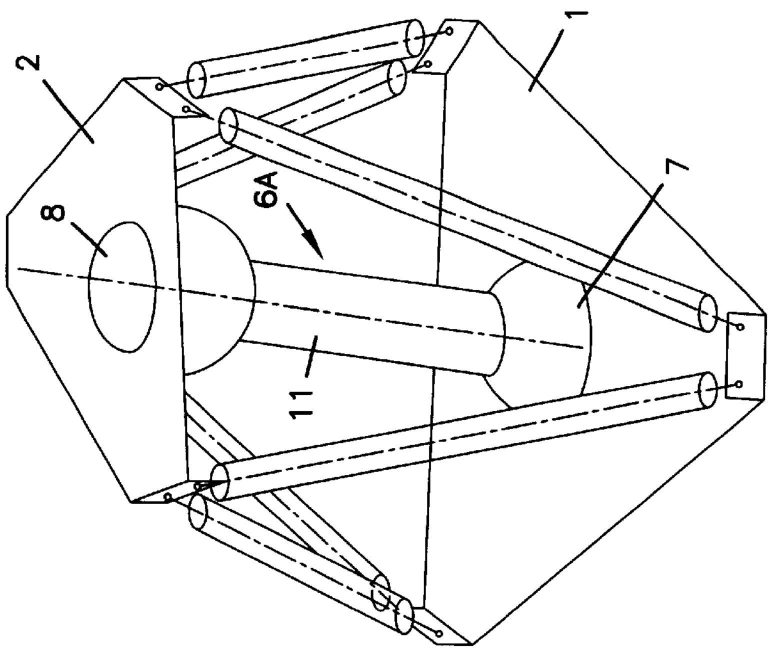
FIG. 11 is a third embodiment with only five degrees of freedom.

Thus, FIG. 11 shows a device with only five degrees of freedom. This is achieved by using a spacer member **6*a* with constant length. Just as the variable spacer member of FIG. 2, it comprises two balls 7, 8, both of which are, however, rigidly connected to rod 11. Hence, the allowed surface of displacement of movable platform 2** is restricted to the calotte of a sphere.

Figure 12:
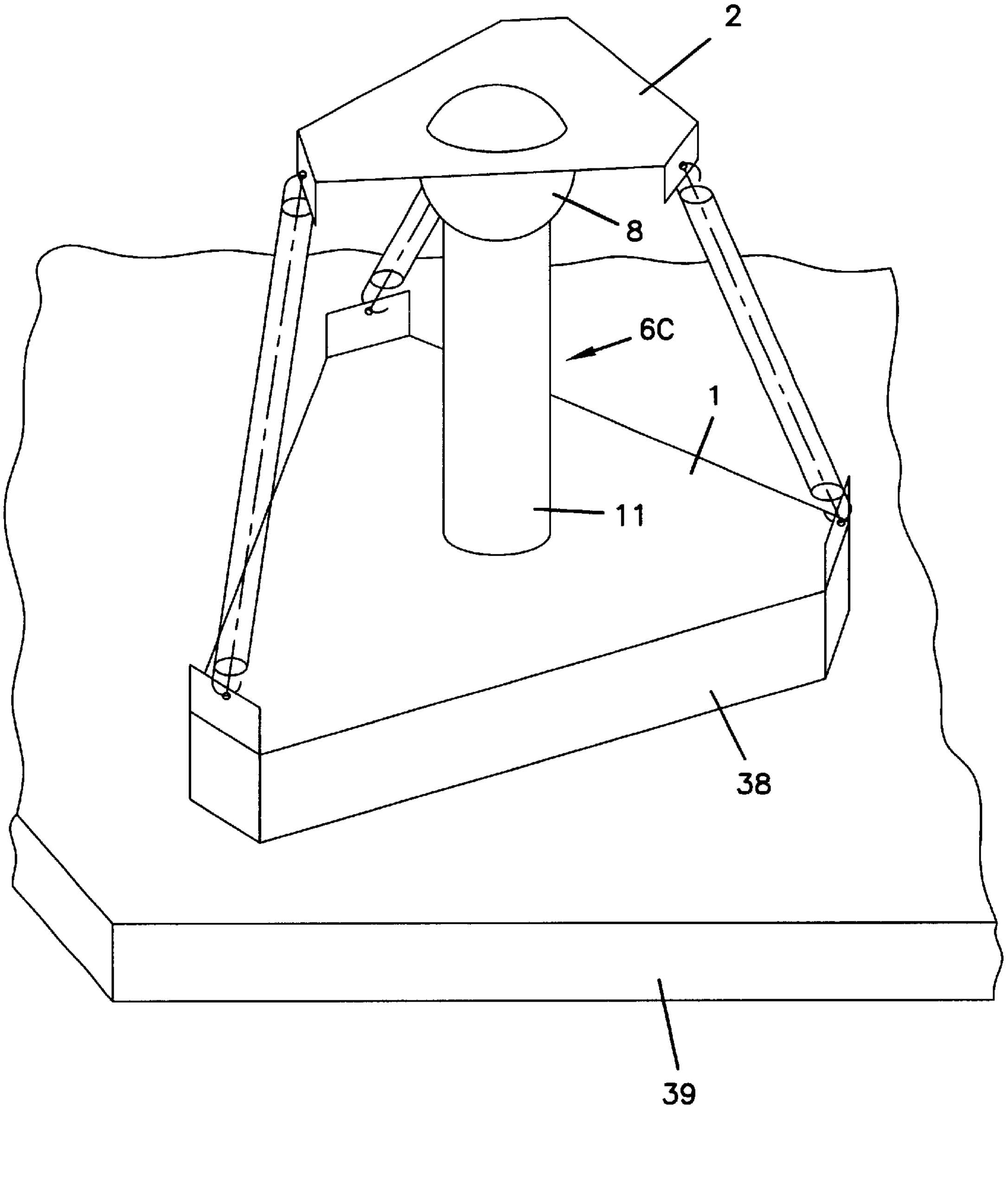
FIG. 12 is a fourth embodiment of the invention.

In FIG. 12, a further embodiment is shown, where upper platform 2 has only three degrees of freedom in respect to lower platform 1. This is achieved by rigidly connecting spacer member **6*c* with lower platform 1, while it forms a ball-and-socket joint 8 with upper platform 2** only.

As indicated in FIG. 12, this device can also be provided with a further level. For this purpose, platform 1 is e.g. placed on a socket 38, into which a conventional computer mouse displaceable in two dimensions is integrated. Socket 38 rests on the surface of a table 39. Hence, the surface of the table 39 can be considered to be a third reference member of the device, in respect to which the second reference member can be displaced in two dimensions. Coupling between the first and third reference member can also be implemented in an other manner, such that e.g. displacements in three translational degrees of freedom are possible as well.

Figure 13:
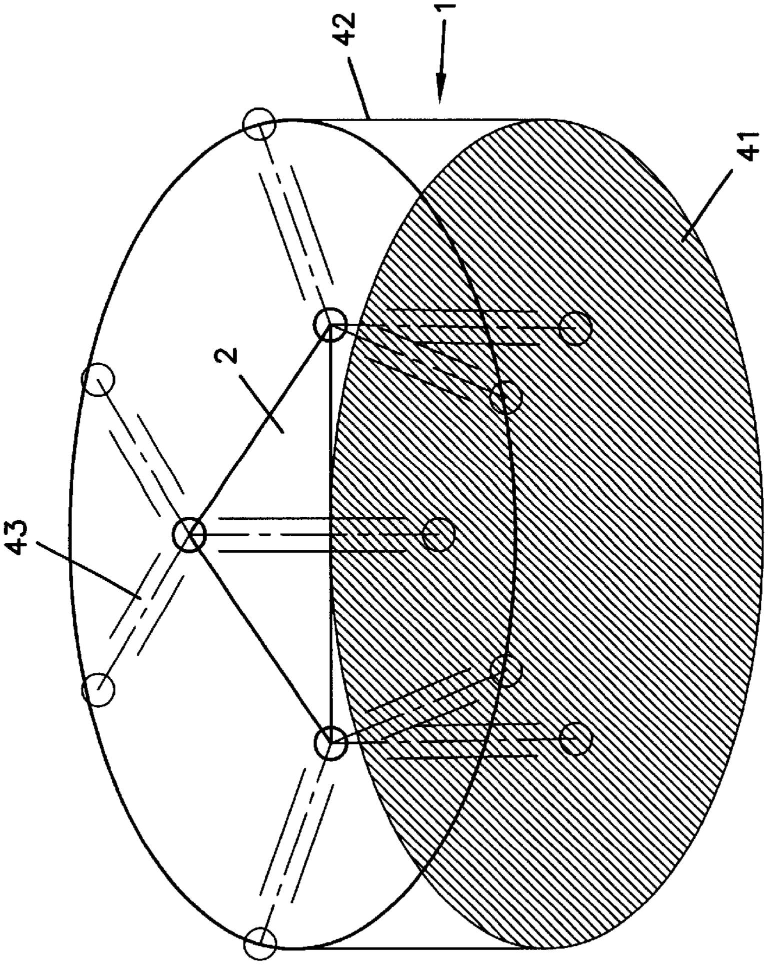
FIG. 13 is a fifth embodiment of the invention with extension springs.

FIG. 13 schematically shows an embodiment of the invention that uses tension springs only. Here, fixed platform 1 is e.g. designed as a cup with a bottom 41 and a cylindrical side wall 42, in which movable platform 2 is suspended on a total of nine tension springs 43. Two tension springs 43 extend from each corner of the movable platform to the upper rim of side wall 42 and one to floor 41. Also in this arrangement, the lengths springs can e.g. be measured with the means mentioned above. The application of nine springs has the advantage that even large displacements still can be calculated robustly by means of balancing calculations.

Figure 14:
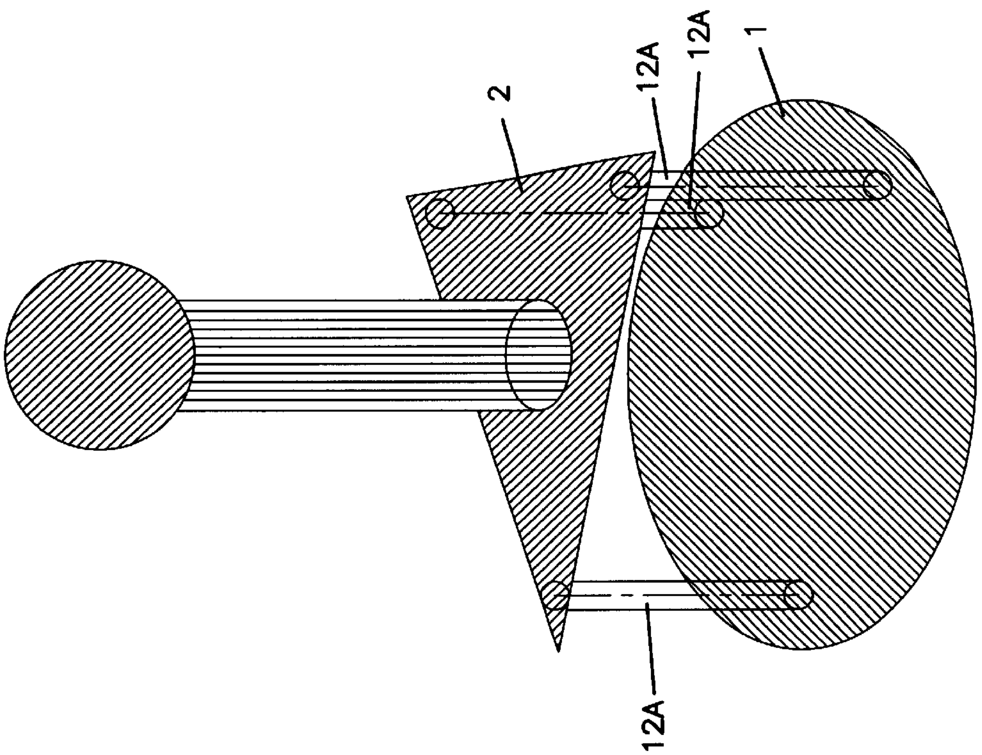
FIG. 14 is a sixth embodiment of the invention with pressure springs.

FIG. 14 schematically shows an embodiment of the invention where only pressure springs **12*a* are used for connecting fixed platform 1 with movable platform 2**. Here, too, the deformation of the springs can be determined with the methods mentioned above, such that the displacements of the joy stick type handle can be determined in two or three degrees of freedom. Preferably, for this purpose, the degrees of freedom of the handle are limited to two or three, respectively.

Figure 15:
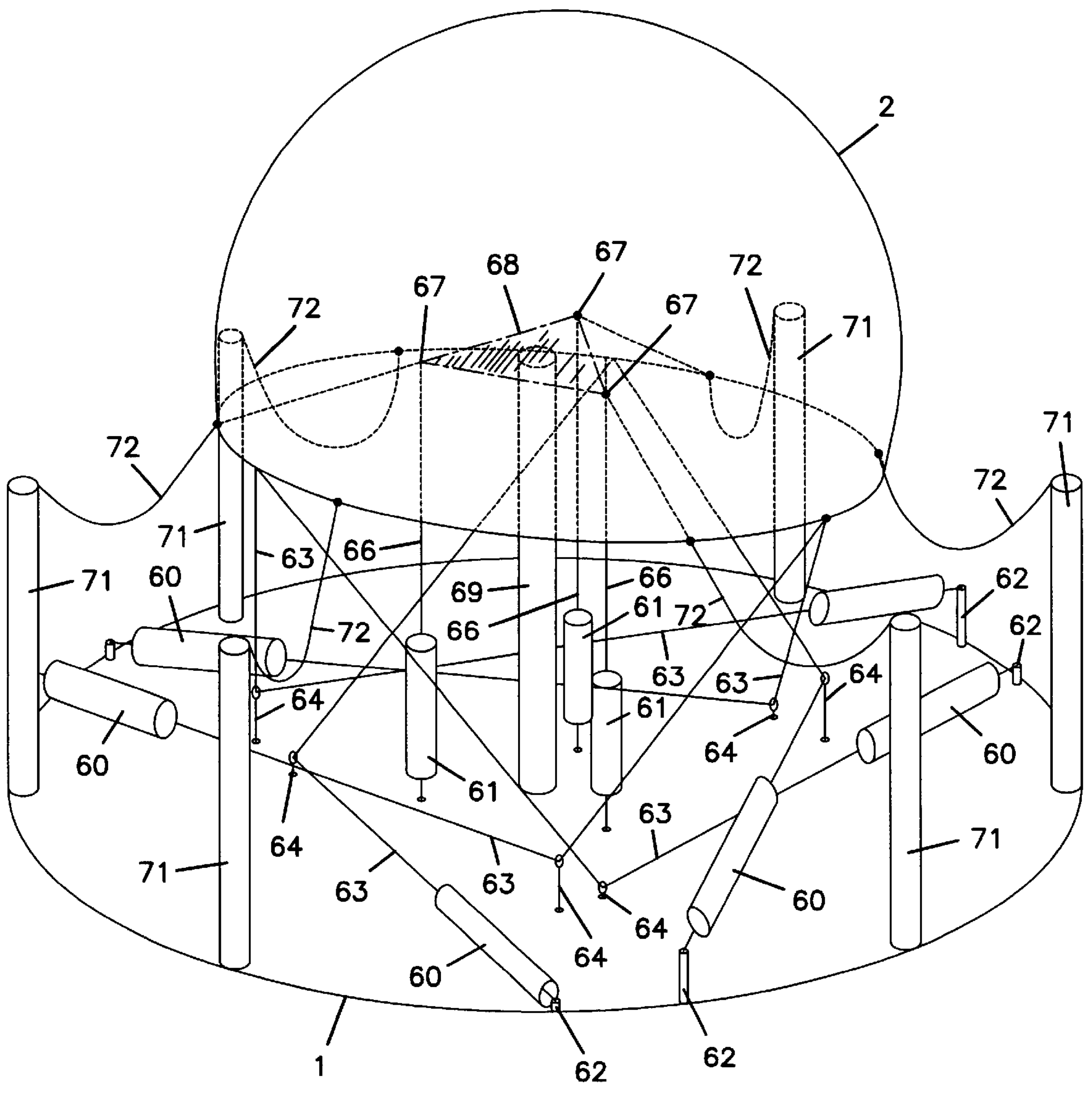
FIG. 15 is a further embodiment of the invention with a total of nine springs.

FIG. 15 shows a further embodiment of the invention. In this embodiment, platform 2 is designed to be a hollow half sphere and can be used as a handle. The coupler between platform 1 and platform 2 comprises nine coil springs 60, 61. Six coil springs 60 arranged horizontally are used as measuring elements by determining their inductivity in the manner described above. Each of the horizontal springs 60 is connected at one end with a pin 62, which is rigidly anchored in platform 1. On its other end, it is connected via a flexible connection member, i.e. a string or a wire 63, with platform 2. Each spring or wire 63 is deviated by a hook 64 mounted to platform 1, such that the springs 60 can extend horizontally while the strings or wires 63 are deviated from the plane of the springs 60. In this way, more room is available for the springs 60. In addition to this, it is possible to house the springs in a housing (not shown), for suppressing interfering signals.

Between platform 1 and 2 the strings or wires 63 extend in the same geometry as the springs 3 of the embodiment of FIG. 1, such that the relative position of the two platforms 1, 2 can be calculated from the variations of lengths in simple and numerically stable manner.

It is also possible to anchor the springs 60 at one end in the points 64 and at their other end in platform 2 such that they take the place of the strings or wires 63. The strings or wires can also be dispensed with and hooks for deviation are not necessary anymore.

The coupler of FIG. 15 further comprises three vertical springs 61. They are anchored at one end in platform 1. At their other end, they are each connected via a wire or string 66 to platform 2. The wires or strings 66 are deviated by three hooks 67. The hooks are located at the corners of a triangular plate 68, which is resting on a column 69. Column 69 is rigidly connected to platform 1. The purpose of the parts 61, 66–69 lies primarily in receiving the weight of platform 2 and in acting against the pulling force of the springs 60, i.e. they serve as a spacer member between both platforms.

Depending on the frictional losses in the hooks 64 and 67, the arrangement of FIG. 15 can be self-restoring or not. If no automatic restoration is desired, frictional losses are chosen to be large. If the frictional losses are small, platform 2 automatically goes back into its equilibrium position after a displacement.

The deviation for the springs 61 or their wires or strings 66 can be dispensed with as well if the springs extend directly between the points 67 and the lower rim of platform 2.

Six vertical rods 71 are arranged along the periphery of platform 1. At the upper end of each rod 71, a safety string 72 is attached, which is connected to platform 2. Rods 71 and strings 72 limit the range of displacements of platform 2 in respect to platform 1.

Figure 16:
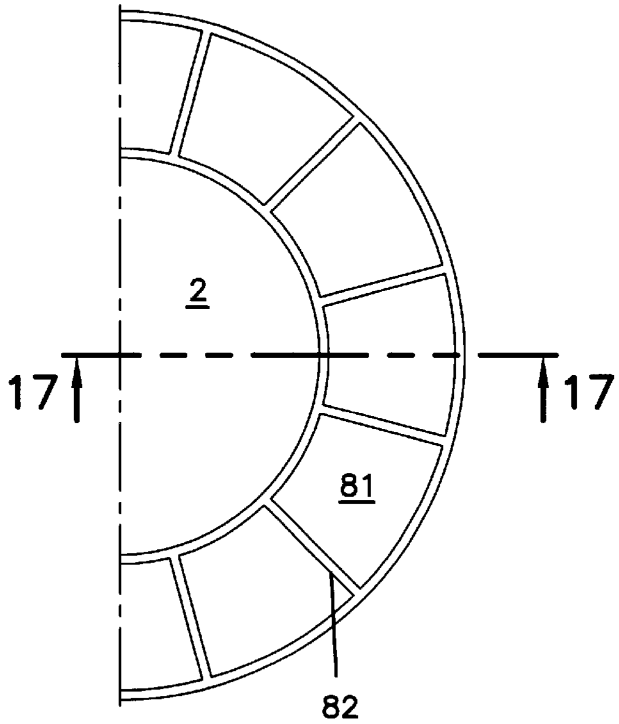
FIG. 16 is an alternative to the embodiment of FIG. 15 with covering bellow from above, wherein only the right half of the figure is shown.
Figure 17:
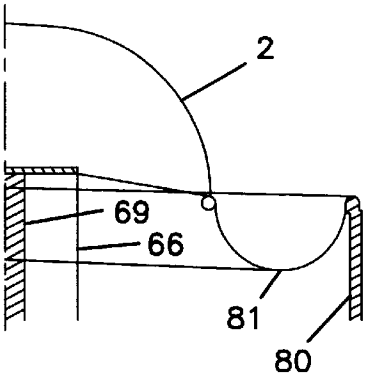
FIG. 17 is a vertical section along line XVII—XVII of FIG. 16.

It is also possible to provide e.g. a cylindrical wall instead of the rods 71, extending along the periphery of platform 1. The strings 71 then extend from the upper rim of the cylindrical wall to the lower rim of platform 2. In place of individual strings, a bellow can be used as well, such as it is illustrated in FIGS. 16 and 17. Here, 80 designates the cylindrical wall, to the upper rim of which the bellow 81 is attached. Bellow 81 seals the device on its upper side. It consists of an annular, foil-like, flexible material, which is dimensioned such that it hangs loosely if the platform 2 is in its center position. Furthermore, radial ribs 82 are formed in the bellow 81, which are more tension proof than the remaining bellow. They take the place of the strings 72 and limit the range of displacement of platform 2. The ribs 82 can be worked into the bellow or e.g. extend below the bellow.

Figure 18:
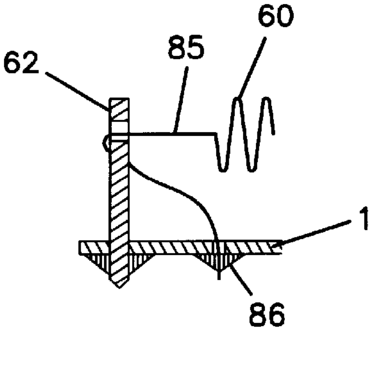
FIG. 18 is the attachment of the springs of the embodiment of FIG. 15.

FIG. 18 shows a vertical cross section through a spring 60, as it e.g. is used in the embodiment of FIG. 15. For simplifying the set-up, platform 1 is designed as a printed circuit, onto which the measuring electronics are placed. The springs 60 are made of material that can be soldered, preferably beryllium bronze. At their outer ends they end in a straight wire section 85. This wire section 85 is led through a hole in one of the pins 62 and from there to a soldering point 86 on platform 1. Behind pin 62, wire section 85 is bent such that the axial pulling force of spring 60 is received by pin 62, i.e. pin 62 is used as an anchor. In this way, soldering point 86, which is connected to the evaluating circuitry, remains force free. Corresponding anchors of the springs can also be used for the other embodiments of the invention shown here, at one end or a both ends.

In general, all the principles of measurement discussed here can also be used for input devices or joy sticks with only two or three degrees of freedom, respectively.

As mentioned initially, the device according to the invention can be used as an input element for computers of the type of a computer mouse. Another application of the device relates to a measuring sensor, the displacements of which caused by contact with an object to be measured provide complete information about the position and orientation of the surface element that has been touched.

If the device is used as a computer mouse, two buttons in addition to the known ones are preferably provided. These additional buttons can be used for switching the mouse on and off, such that the object moved by the mouse does not fall back into its central position after releasing the mouse.

The device can also be used as a measuring system for the continuous tracking of a robot, wherein one platform is mounted to the fixed and the other to the moved part (e.g. a gripper hand) of the robot.

A further application relates to the control of vehicles, wherein the vehicle driver can control all possible displacements of the vehicle with the device according to the invention instead of using the conventional separate control devices (steering wheel, gas and brake pedals, stick etc.).

The device can also be used for controlling cranes and robots.

The displacement of the movable platform can also be caused by other parts of the human body but a hand, such as with one or both feet.

In the present embodiments spring members of metal, in particular a well conducting material that can be soldered are used, such as beryllium bronze. It is, however, possible to use elastic elements of another material, in particular plastic.

While in the present application preferred embodiments of the invention are shown, it is to be distinctly understood that the invention is not limited thereto but can also be carried out in other manner within the scope of the following claims.

What is claimed is:

1. Position measurement device comprising a first and a second reference member, a plurality of springs extending between said first and second reference members in such a way that said second reference member is supported with respect to said first reference member entirely by said springs and is displaceable with respect to said first reference member with six degrees of freedom such that said springs change in length when said second reference member is displaced with respect to said first reference member, and measuring means connected to said springs, said measuring means being adapted to determine a relative position of said reference members in at least three degrees of freedom by measuring inductivities of said springs.

2. Position measurement device of claim 1, wherein said springs comprise cores disposed therein, said cores having a magnetic permeability such that for a change in length of said springs, a change of inductivity of said springs is greater with said cores than without.

3. Position measurement device of claim 1, wherein said measuring means comprises at least one LC oscillator circuit adapted to oscillate at a frequency dependent on said inductivities, said measuring means further comprising a frequency counter adapted to measure said frequency.

4. Position measurement device of claim 1, wherein said measuring means comprises a control means adapted to measure said inductivities sequentially.

5. Position measurement device of claim 1, comprising at least six mutually non-parallel springs.

6. Position measurement device of claim 1, wherein said second reference member comprises a handle adapted to be displaceable in translational degrees of freedom by at least 1 cm and in rotative degrees of freedom by at least 20 degrees.

7. Position measurement device of claim 1, wherein said springs comprise extension springs having first and second ends, and wherein said device comprises attachment means adapted to attach said first and second ends of said springs to said first and second reference members, said attachment means comprising anchor means adapted to receive a force of said springs, each of said springs further comprising wires connected to said anchor means, said wires being further connected to one of said first and second reference members such that said wires do not receive said force of said springs.

8. Position measurement device of claim 1, comprising at least six springs between said first and second reference members.

9. Position measurement device comprising a first and a second reference member, a plurality of extension springs extending between said first and second reference members in such a way that said second reference member is supported with respect to said first reference member entirely by said extension springs and is displaceable with respect to said first reference member with six degrees of freedom such that said extension springs change in length when said second reference member is displaced with respect to said first reference member, and measuring means connected to said extension springs, said measuring means being adapted to determine a relative position of said reference members in at least three degrees of freedom by measuring inductivities of said extension springs.

10. Position measurement device of claim 1, wherein said springs comprise shells disposed about said springs, said shells having a magnetic permeability such that for a change in length of said springs, a change of inductivity of said springs is greater with said shell than without.

11. Position measurement device of claim 1, wherein said springs are coil springs.

12. Position measurement device of claim 1, wherein said springs are mutually non-parallel.

13. Position measurement device of claim 1, wherein for each degree of freedom of displacement of said second reference member with respect to said first reference member, said measuring means is connected to one spring.

14. Position measurement device comprising a first and a second reference member, a plurality of springs extending between said first and said second reference members in such a way that said second reference member is supported with respect to said first reference member entirely by said springs, is suspended in an equilibrium position of said springs, and is displaceable with respect to said first reference member with six degrees of freedom such that said springs change in length when said second reference member is displaced from said equilibrium position, and measuring means connected to said springs, said measuring means being adapted to determine a relative position of said reference members in at least three degrees of freedom by measuring inductivities of said springs.

15. Position measurement device of claim 1, wherein said springs are arranged such that a determination of a relative position of said second reference member with respect to said first reference member from measurements of lengths of said springs is enabled.

* * * * *